United States Patent
Nowak et al.

(10) Patent No.: US 9,786,765 B2
(45) Date of Patent: Oct. 10, 2017

(54) FINFET HAVING NOTCHED FINS AND METHOD OF FORMING SAME

(71) Applicant: GLOBALFOUNDRIES INC., Grand Cayman (KY)

(72) Inventors: Edward J. Nowak, Shelburne, VT (US); Brent A. Anderson, Jericho, VT (US); Andreas Scholze, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/044,431

(22) Filed: Feb. 16, 2016

(65) Prior Publication Data

US 2017/0236917 A1   Aug. 17, 2017

(51) Int. Cl.
 *H01L 29/78* (2006.01)
 *H01L 29/06* (2006.01)
 *H01L 21/762* (2006.01)
 *H01L 29/66* (2006.01)
 *H01L 21/28* (2006.01)

(52) U.S. Cl.
 CPC .. *H01L 29/66545* (2013.01); *H01L 21/28079* (2013.01); *H01L 29/66795* (2013.01); *H01L 29/785* (2013.01)

(58) Field of Classification Search
 CPC ......... H01L 27/0886; H01L 21/823431; H01L 21/823821; H01L 21/845; H01L 27/0924; H01L 27/1211; H01L 29/41791; H01L 29/66795; H01L 29/785; H01L 29/7851; H01L 29/66545; H01L 29/0657
 See application file for complete search history.

(56) References Cited

U.S. PATENT DOCUMENTS

| | | | |
|---|---|---|---|
| 7,407,847 B2 | 8/2008 | Doyle et al. | |
| 7,728,360 B2 | 6/2010 | Chen et al. | |
| 7,759,203 B2 | 7/2010 | Jang | |
| 8,703,565 B2 | 4/2014 | Chang et al. | |
| 8,759,943 B2 | 6/2014 | Tseng et al. | |
| 8,912,602 B2 | 12/2014 | Hsu et al. | |
| 2007/0029576 A1 | 2/2007 | Nowak et al. | |
| 2011/0193175 A1* | 8/2011 | Huang | H01L 21/823431 257/386 |
| 2013/0200468 A1* | 8/2013 | Cai | H01L 29/66545 257/401 |

(Continued)

*Primary Examiner* — Olik Chaudhuri
*Assistant Examiner* — Pauline Vu
(74) *Attorney, Agent, or Firm* — Michael Le Strange; Hoffman Warnick LLC

(57) ABSTRACT

One aspect of the disclosure provides for a method of forming a replacement gate structure. The method may include: removing a dummy gate from over a set of fins to form an opening in a dielectric layer exposing the set of fins, each fin in the set of fins being substantially separated from an adjacent fin in the set of fins via an dielectric; forming a protective cap layer within the opening over the exposed set of fins; removing a portion of the dielectric on each side of each fin in the set of fins; undercutting each fin by removing a portion of each fin in the set of fins to create a notch disposed under the protective cap layer; substantially filling each notch with an oxide; forming a gate dielectric over each fin in the set of fins; and forming a gate conductor over the gate dielectric, thereby forming the replacement gate structure.

20 Claims, 6 Drawing Sheets

(56) References Cited

U.S. PATENT DOCUMENTS

| | | | |
|---|---|---|---|
| 2013/0320455 A1* | 12/2013 | Cappellani | H01L 29/66795 257/368 |
| 2014/0197456 A1* | 7/2014 | Wang | H01L 29/785 257/192 |
| 2014/0203334 A1* | 7/2014 | Colinge | H01L 29/66795 257/288 |
| 2014/0239393 A1* | 8/2014 | Kuo | H01L 29/785 257/347 |
| 2014/0361336 A1 | 12/2014 | Chen et al. | |
| 2015/0008483 A1 | 1/2015 | Ching et al. | |
| 2015/0035046 A1* | 2/2015 | Kim | H01L 29/42392 257/327 |
| 2015/0069474 A1* | 3/2015 | Ching | H01L 29/7842 257/288 |
| 2015/0187944 A1* | 7/2015 | Ching | H01L 29/7851 257/190 |

* cited by examiner

FINFET HAVING NOTCHED FINS AND METHOD OF FORMING SAME

BACKGROUND

Technical Field

The present disclosure relates to integrated circuits, and more particularly, to a fin-shaped field-effect-transistor (FINFET) having notched fins, and a method of forming the same.

Related Art

In integrated circuit (IC) structures, a transistor is a critical component for implementing digital circuitry designs. Generally, a transistor includes three electrical terminals: a source, a drain, and a gate. By applying different voltages to the gate terminal, electric current from the source to the drain can be turned on and off. A common type of transistor is a metal oxide field effect transistor (MOSFET). One type of MOSFET structure is a "FINFET," and may be formed upon a semiconductor-on-insulator (SOI) layer and buried insulator layer. A FINFET can include a semiconductor structure etched into a "fin" shaped body, with one side of the fin acting as a source terminal and the other side of the fin acting as a drain terminal. A gate structure, typically composed of polysilicon and/or a metal, can be formed around one or more of the semiconductor fins. By applying a voltage to the gate structure, an electrically conductive channel can be created between the source and drain terminals of each fin in contact with the gate.

In some cases, a FINFET may be desirable in IC structures which do not include an SOI layer with a corresponding buried insulator layer. For example, processors for mobile applications can include forming transistor structures on a bulk substrate instead of an SOI-type structure. Planar devices can be formed conventionally within the bulk substrate without substantial modifications. A FINFET transistor may also be adapted for use on bulk substrate material instead of SOI. However, FINFETs on bulk substrates can have a leakage path in the sub-fin region, i.e., the region of the fin below the gate. This leads to significant drain to source current, i.e., punch-through current, which has to be suppressed with a punch-through stop implant. A punch-though stop implant includes implanting dopants to prevent expansion of the drain depletion into the source terminal. However, such implanting leads to unwanted high doping concentrations in the fin which degrades carrier mobility and introduces within-fin non-uniformities.

SUMMARY

One aspect of the disclosure provides for a method of forming a transistor. The method may comprise: removing a dummy gate from over a set of fins to form an opening in a dielectric layer exposing the set of fins, each fin in the set of fins being substantially separated from an adjacent fin in the set of fins via a dielectric; forming a protective cap layer within the opening over the exposed set of fins; removing a portion of the dielectric on each side of each fin in the set of fins; undercutting each fin in the set of fins by removing a portion of each fin in the set of fins to create a notch disposed under the protective cap layer; substantially filling each notch with an insulator; forming a gate dielectric over each fin in the set of fins; and forming a gate conductor over the gate dielectric, thereby forming the transistor.

A second aspect of the disclosure provides for a method of forming an integrated circuit structure. The method may comprise: forming a fin-shaped field-effect-transistor (FINFET) on a substrate, the FINFET including a set of fins on the substrate, a dummy gate stack over the set of fins, and a dielectric substantially separating each fin in the set of fins from an adjacent fin in the set of fins; removing the dummy gate to expose the set of fins; forming a protective cap layer over the exposed set of fins; removing a portion of dielectric on each side of each fin in the set of fins; undercutting each fin in the set of fins by removing a portion of each fin in the set of fins to create a notch disposed under the protective cap layer; substantially filling each notch with an insulator; forming a gate dielectric over each fin in the set of fins; and forming a gate conductor over the gate dielectric, thereby forming the integrated circuit structure.

A third aspect of the disclosure provides for a fin-shaped field-effect-transistor (FINFET). The FINFET may comprise: a set of fins on a substrate, each fin in the set of fins being separated from an adjacent fin in the set of fins by a dielectric; wherein each fin in the set of fins includes a first portion having a width that is smaller than a remaining portion of the fin; an insulator being disposed over the dielectric and being adjacent to the first portion of each fin in the set of fins; a gate dielectric being disposed over a portion of the insulator and over a second portion of each fin in the set of fins; and a gate conductor over the gate dielectric, wherein the first portion of each fin in the set of fins is covered by the gate conductor.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the invention. In the drawings, like numbering represents like elements between the drawings.

DETAILED DESCRIPTION

The present disclosure relates to integrated circuits, and more particularly, to fin-shaped field-effect-transistors (FINFETs) having notched fins, and a method of forming the same. Specifically, aspects of the present disclosure provide for a structure and method that avoid punch-through current while also avoiding compromises to performance, e.g. degraded carrier mobility. Therefore, the manufacturing strengths of bulk substrate-based FINFETs are maintained and the losses to device performance are reduced.

Aspects of the present disclosure are shown and described with respect to a FINFET. However, it is to be understood that aspects of the present disclosure are equally applicable to other types of transistors, such as but not limited to field-effect transistors, including transistors with different geometrical orientations and shapes of their channels such as planar FETs, surround-gate FETs, multiple-gate FETs, nanowire or nano-sheet FETs, and vertical FETs.

Figure 1:
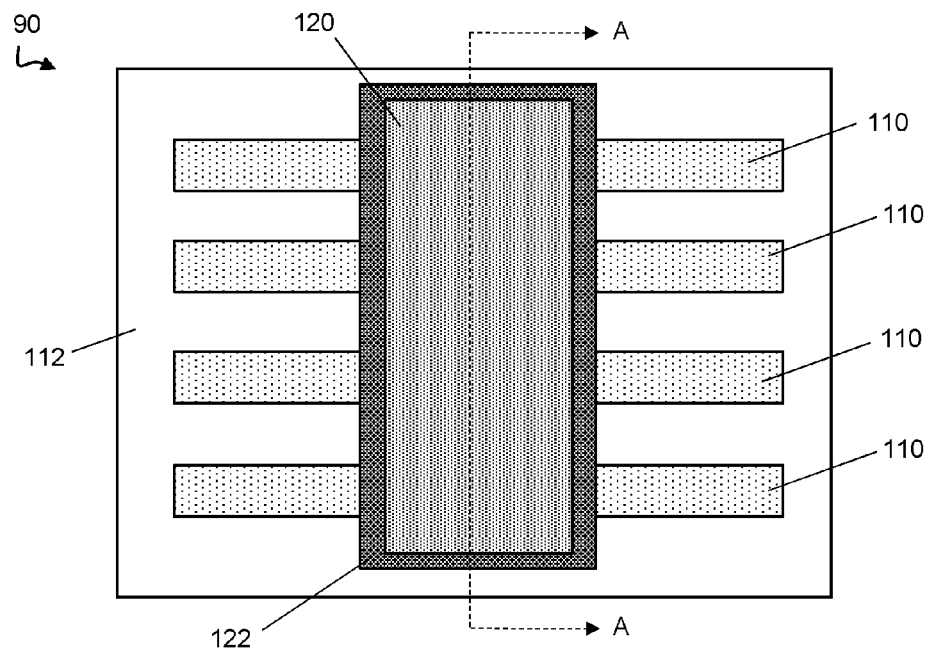
FIG. 1 shows a top-down view of an integrated circuit structure undergoing aspects of a method according to embodiments of the disclosure.
Figure 2:
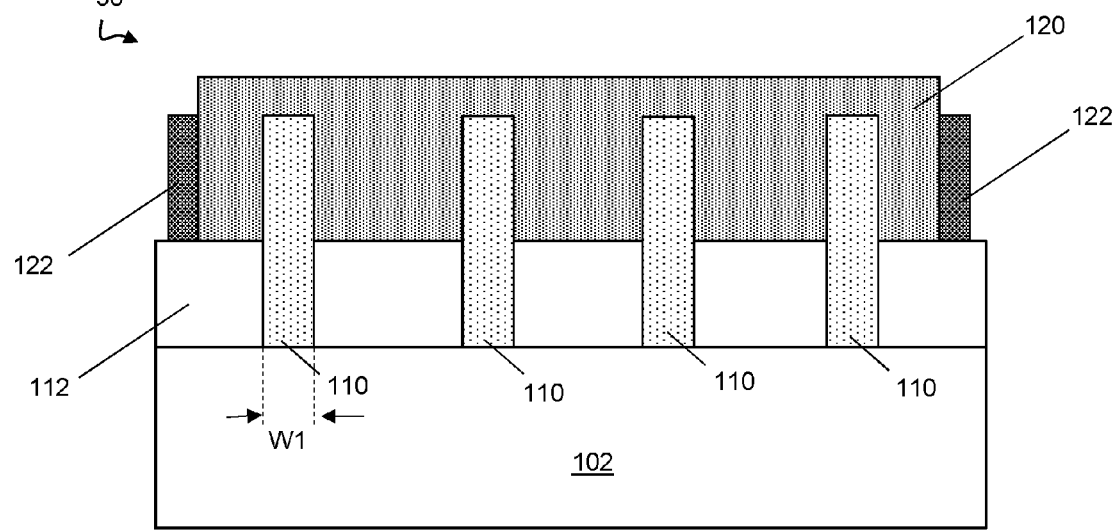
FIG. 2 shows a cross-sectional view of the integrated circuit structure of FIG. 1 taken along line A-A.

FIG. 1 shows a top-down view of a FINFET 90. FIG. 2 shows a cross-sectional view of FINFET 90 of FIG. 1 taken along line A-A. Referring to FIGS. 1-2 together, FINFET 90 may include a bulk substrate 102 from which a plurality of fins 110 are patterned. Bulk substrates generally include a layer or wafer of semiconductor material without buried insulator layers contained therein, in contrast to silicon-on-insulator (SOI) substrates which include both semiconductor and insulating materials. Bulk substrate 102 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of bulk substrate 102 or a portion thereof may be strained. Fins 110 may each have a width W1 of approximately 3 nanometers (nm) to approximately 20 nm. As used herein "approximately" is intended to include values, for example, within 10% of the stated values.

Overlying bulk substrate 102 may be a dielectric layer 112. Dielectric layer 112 may be formed via deposition such that dielectric layer 112 covers fins 110 and substrate 102. Dielectric layer 112 can be composed of silicon oxide ($SiO_2$). Other dielectric materials can include, e.g., silicon nitride ($Si_3N_4$), fluorinated $SiO_2$ (FSG), hydrogenated silicon oxycarbide (SiCOH), porous SiCOH, boro-phosphosilicate glass (BPSG), silsesquioxanes, carbon (C) doped oxides (i.e., organosilicates) that include atoms of silicon (Si), carbon (C), oxygen (O), and/or hydrogen (H), other low dielectric constant (<3.9) material, or layers thereof. As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Dielectric layer 112 may be planarized to an upper surface of fins 110. Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Further, dielectric layer 112 may be etched to expose portions of fins 110 such that an upper surface of dielectric layer 112 is beneath the upper surface of fins 110. "Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while leaving another material (such as polysilicon) relatively intact. The ability to selectively etch particular materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Still referring to FIGS. 1-2, a dummy gate 120 can be formed above and/or around fins 110. Dummy gate 120 can be composed of a placeholder material, which can be removed in a later fabrication process and then replaced with a functional gate material. Dummy gate 120 can be in the form of a continuous structure which "wraps" around the surface of each fin 110. Dummy gate 120 can be oriented substantially perpendicular to fins 110. As such herein, "substantially" refers to largely, for the most part, entirely specified or any slight deviation which provides the same technical benefits of the disclosure.

One or more spacers 122 can be formed on fins 110 and/or dummy gate 120, e.g., by being deposited onto dummy gate 120 or onto the surface of dielectric layer 112. Spacers 122 can electrically isolate functional gates from other components of an IC structure, e.g., source and drain terminals. Spacers 122 can be composed of, e.g., an insulating material such as a nitride or an oxide compound, including, for example, the various types of insulating materials described herein. Exposed portions of fins 110 may be doped to form sources and drains (not shown) as known in the art.

Figure 3:
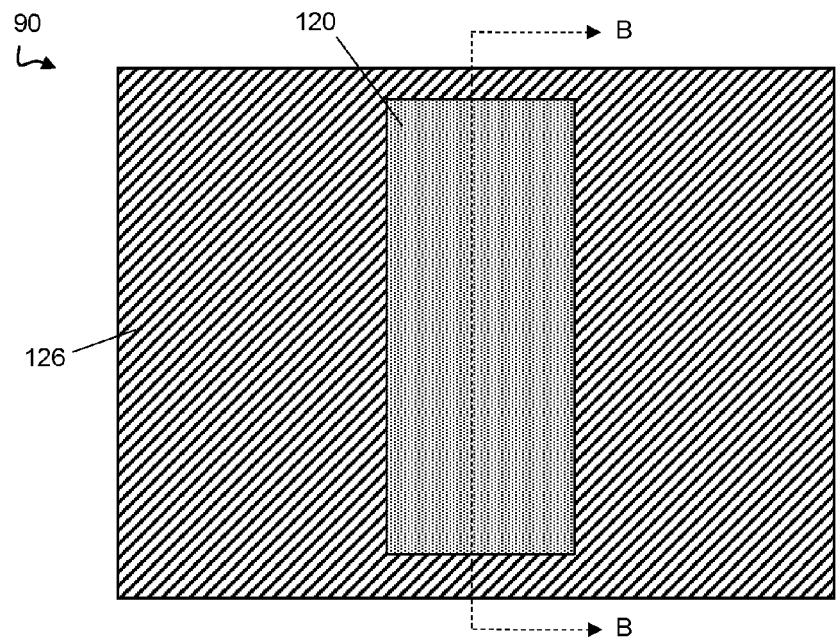
FIG. 3 shows a top-down view of an integrated circuit structure undergoing aspects of the method according to embodiments of the disclosure.
Figure 4:
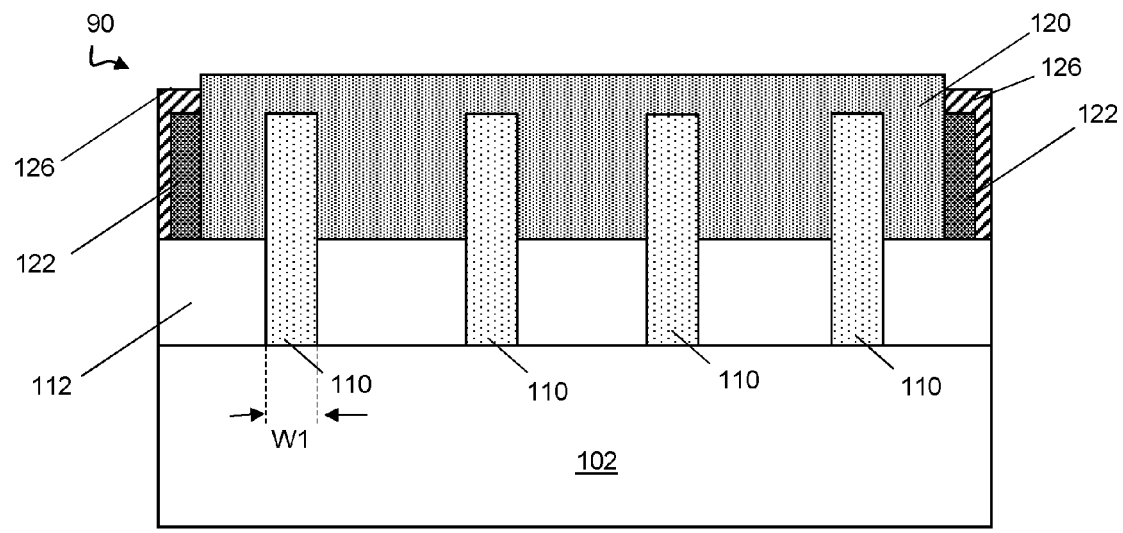
FIG. 4 shows a cross-sectional view of the integrated circuit of FIG. 3 taken along line B-B.

FIG. 3 shows a top-down view of FINFET 90. FIG. 4 shows a cross-sectional view of FINFET 90 of FIG. 3 taken along line B-B. Referring to FIGS. 3-4 together, another dielectric layer 126 may be formed over FINFET 90. Dielectric layer 126 may include any of the dielectric materials listed relative to dielectric layer 112. Dielectric layer 126 may be deposited over FINFET 90, planarized to a top surface of dummy gate 120, and etched back to expose a portion of dummy gate 120.

Figure 5:
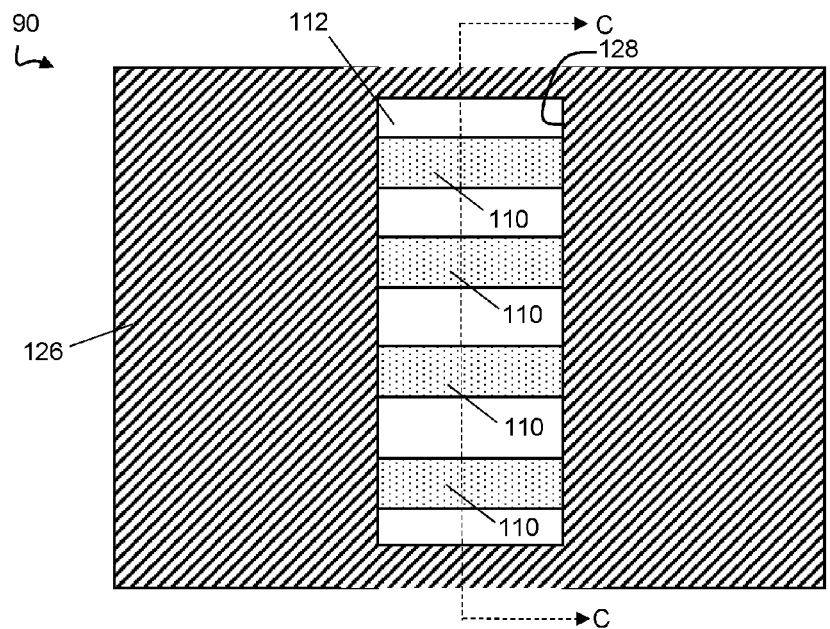
FIG. 5 shows a top-down view of an integrated circuit structure undergoing aspects of the method according to embodiments of the disclosure.
Figure 6:
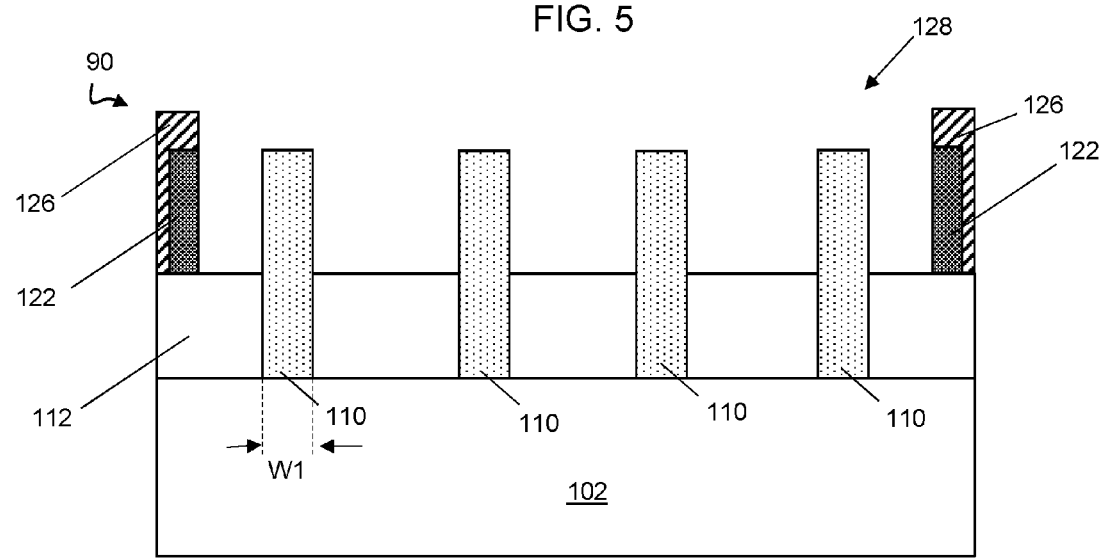
FIG. 6 shows a cross-sectional view of the integrated circuit structure of FIG. 5 taken along line C-C.

FIG. 5 shows a top-down view of FINFET 90. FIG. 6 shows a cross-sectional view of FINFET 90 of FIG. 5 taken along line C-C. Referring to FIGS. 5-6 together, dummy gate 120 (FIG. 3-4) may be removed to form an opening 128 exposing a portion of fins 110 and dielectric layer 112 thereunder. Dummy gate 120 may be removed by an etch selective to dummy gate 120 such as, for example, if the dummy gate is a stack of a thin silicon dioxide ($SiO_2$) layer (approximately 2 nanometers (nm) to 4 nm) and polysilicon, then a potassium hydroxide (KOH) or similar etch will remove the polysilicon portion of the dummy gate, and a dilute hydrogen fluoride (HF) would follow to remove the underlying silicon dioxide ($SiO_2$) layer.

Figure 7:
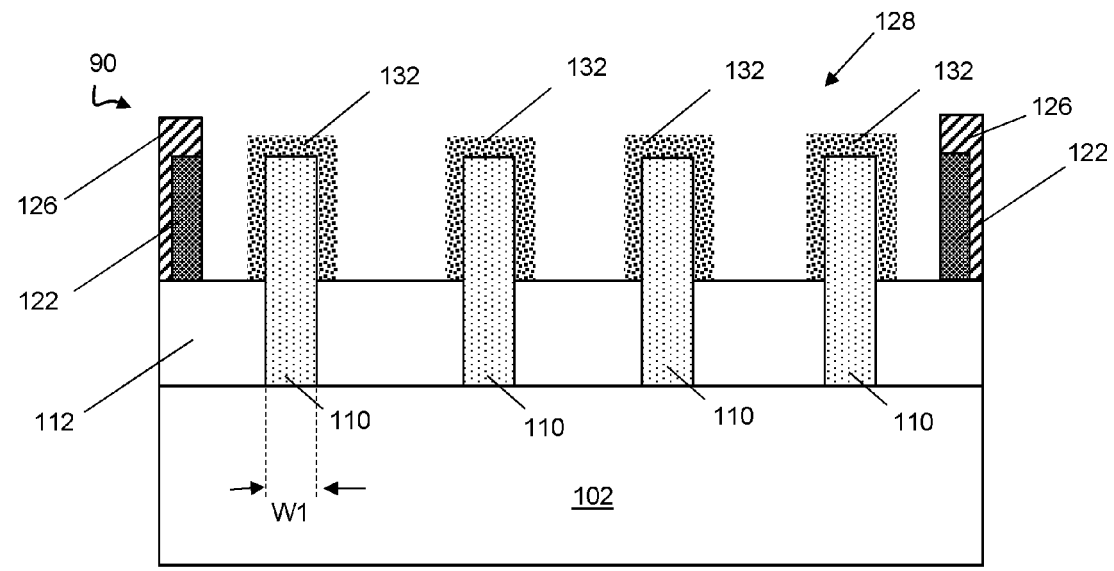
FIGS. 7-12 show the cross-sectional view of the integrated circuit of FIG. 6 undergoing aspects of the method according to embodiments of the disclosure.

FIGS. 7-12 show the cross-sectional view of FIG. 6 undergoing additional steps according to aspects of the disclosure. As shown in FIG. 7, a protective cap layer 132 is formed over fins 110. Protective cap layer 132 may be composed of silicon germanium (SiGe) or silicon nitride ($Si_3N_4$). Protective cap layer 132 may be formed via selective epitaxial growth of the protective cap layer 132 on fins 110 such that protective cap layer 132 will only form on portions of exposed fins 110 within opening 128. In this way, protective cap layer 132 covers a portion of dielectric layer 112 that is immediately adjacent to fins 110. The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces, such as silicon dioxide or silicon nitride surfaces.

Figure 8:
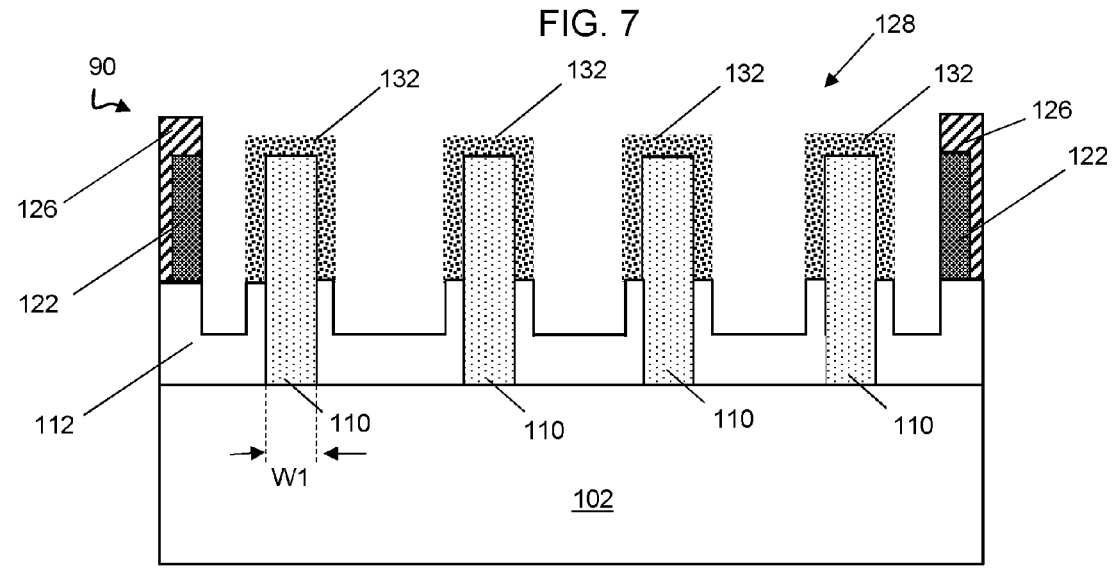
Figure 9:
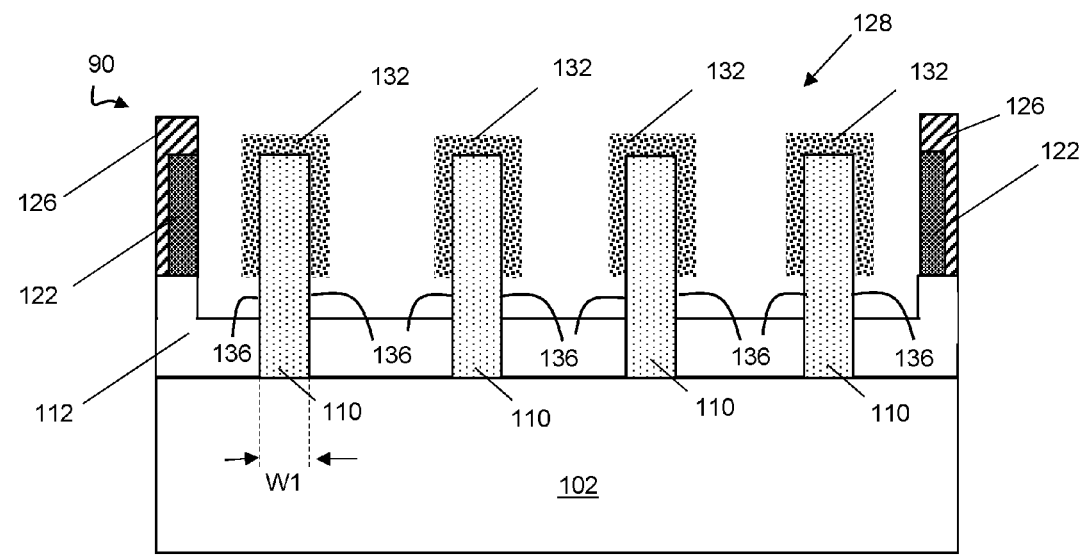

After protective cap layer 132 is formed, exposed dielectric layer 112 within opening 128 may be recessed as shown in FIG. 8. In one embodiment, this process includes an anisotropic (vertical) oxide etch to etch back a vertical portion of dielectric layer 112 that is not covered by protective cap layer 132. Further, dielectric layer 112 may be horizontally, i.e., laterally, etched such that a portion of dielectric layer 112 that is covered by protective cap layer 132 is removed as shown in FIG. 9. The horizontal etch may include a horizontal oxide etch. This horizontal etch exposes a portion 136 on each side of fins 110 which will facilitate the formation of notched fins as described herein. In some embodiments, an isotropic silicon dioxide ($SiO_2$) etch with selectivity to fins 112/substrate 102 and protective cap layer 132 may be used to both vertically and horizontally etch dielectric layer 112. For example, such an etch may include the use of hydrofluoric acid (HF) or buffered hydrofluoric acid (BHF) as a solvent. In another embodiment, a RIE may be used to vertically etch dielectric layer 112 while a wet etch, e.g., using hydrofluoric acid (HF), may be used to horizontally etch dielectric layer 112. Alternatively, a single etch with dilute hydrofluoric acid (HF) may be used to simultaneously etch dielectric layer 112 both vertically and horizontally.

Figure 10:
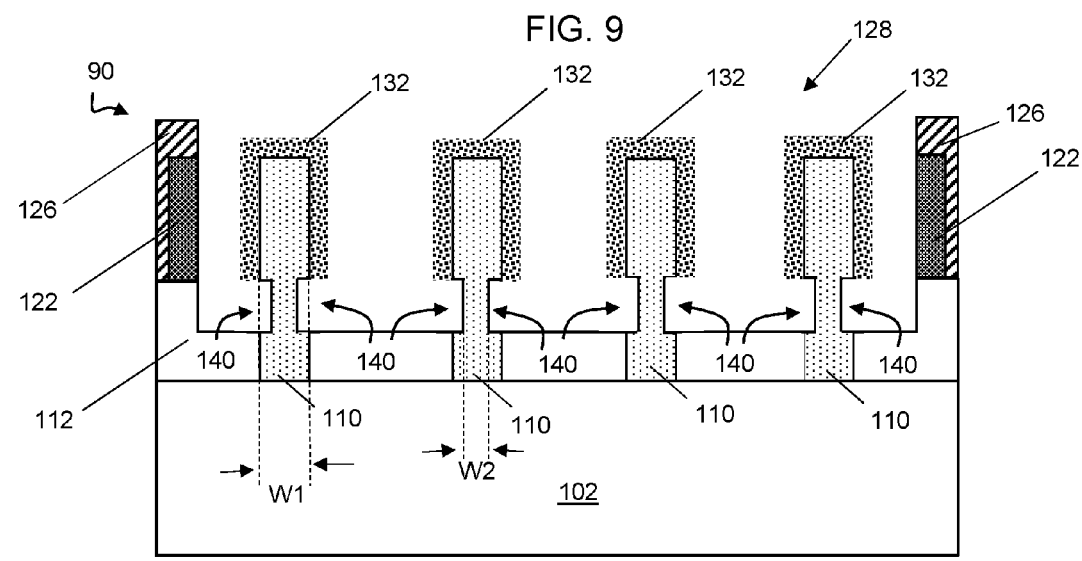

Referring now to FIG. 10, fins 110 may be undercut. That is, portion 136 (FIG. 9) of each fin 110 may be etched, via, for example, a horizontal silicon etch such that a notch 140 is formed under protective cap layer 132 on each side within each fin 110. Such an etch may include an isotropic etch of fins 110 selective to protective cap layer 132 such as, for example, RIE comprised of a combination of tetrafluoromethane ($CF_4$), oxygen ($O_2$), and nitrogen ($N_2$) gases. As a result, a width W2 of fins 110 at the portion of fins 110 where notch 140 is formed may be approximately 5 nm to approximately 10 nm.

Figure 11:
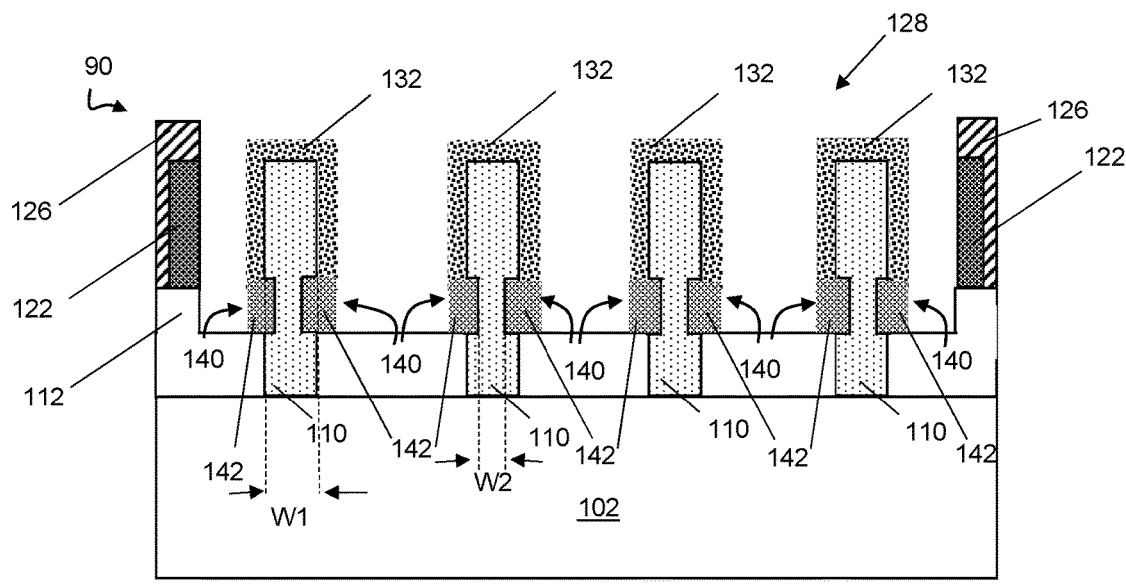

After notches 140 are formed, notches 140 may be substantially filled with an insulator 142 such as, for example, silicon dioxide, silicon oxynitride, or fluorinated silicon oxynitride as shown in FIG. 11. That is, insulator 142 may be conformally deposited over fins 110 including protective cap layer 132 and in the horizontal field between fins 110 to fill notches 140. Insulator 142 may be etched, e.g., via RIE, such that insulator 142 remains within notch 140 beneath protective cap layer 132 but is removed from protective cap layer 132 and from the horizontal field between fins 110.

Figure 12:
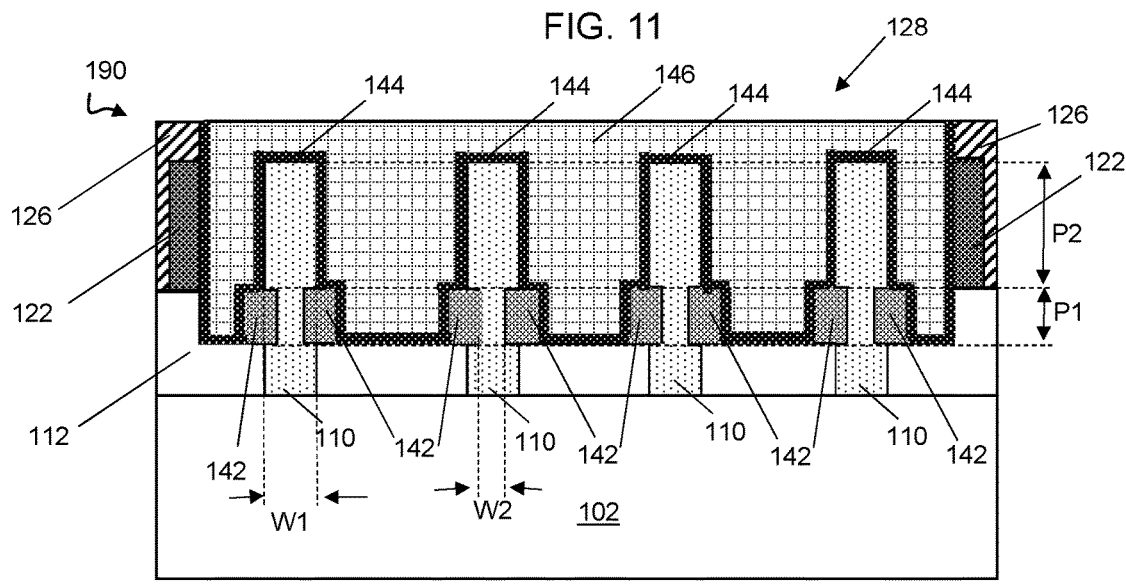

Referring now to FIG. 12, protective cap layer 132 (FIG. 11) may be removed, e.g., etched, to expose fins 110 and insulator 142. A gate dielectric 144 may be formed over exposed portions of fins 110, insulator 142 (notch filler), and the horizontal field between fins 110. However, the removal of protective cap layer 132 may be optional in some embodiments. Therefore, in those embodiments where protective cap layer 132 is removed, gate dielectric 144 may be formed over protective cap layer 132 on fins and insulator 142. Gate dielectric 144 may include, for example, silicon dioxide ($SiO_2$). Further, a gate conductor 146 may be formed over gate dielectric 144 to substantially fill opening 128. Gate conductor 146 may include, for example, at least one of: tungsten (W), tantalum (Ta), and titanium (Ti). It is to be understood that there may be additional materials disposed between gate dielectric 144 and gate conductor 146 such as, for example, work function films, which have been omitted herein for clarity.

The resulting structure after gate conductor 146 is formed may include a FINFET 190 having notched fins. FINFET 190 may include set of fins 110 on a substrate 102. Each fin 110 may be substantially separated from an adjacent fin 110 via dielectric layer 112. Each fin 110 may include a portion P1 having a width W2 that is smaller than a width W1 of a remaining portion P2 of fin 110. Insulator 142 may be disposed over dielectric layer 112 and adjacent to portion P1 on each side of each fin 110. A gate dielectric 144 may be disposed over a portion of insulator 142 and portion P2 of fins 110. Further, FINFET 190 may include a gate conductor 146 over gate dielectric layer 144.

Notches 140 of fins 110 are laterally aligned with and limited to the area below the gate, i.e., gate dielectric 144 and gate conductor 146. In this way, notches 140 do not extend into the source and drain regions (not shown). insulator 142 that fills notches 140 acts as an additional isolation prohibiting current flow from the drain to the source in an area of fins 110 that are not controlled by the gate. A portion of fins 110 remains between notches 140 such that the portion of fins 110 therebetween can still serve as a path for heat dissipation. Therefore, aspects of the present disclosure provide for a structure and method that avoid punch-through current while also avoiding compromises to performance, e.g. degraded carrier mobility.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming a transistor, the method comprising:
    removing a dummy gate from over a set of fins to form an opening in a dielectric layer exposing the set of fins, each fin in the set of fins being substantially separated from an adjacent fin in the set of fins via a dielectric;
    forming a protective cap layer within the opening over the exposed set of fins;
    removing a portion of the dielectric on each side of each fin in the exposed set of fins;
    undercutting each fin in the exposed set of fins by removing a portion of each fin in the exposed set of fins to create a notch disposed under the protective cap layer;
    substantially filling each notch with an insulator,
        wherein the substantially filling of each notch includes forming the insulator such that a sidewall of the insulator is coplanar with a sidewall of the protective cap layer;
    forming a gate dielectric over each fin in the exposed set of fins; and
    forming a gate conductor over the gate dielectric, thereby forming the transistor.

2. The method of claim 1, wherein the removing the portion of the dielectric includes performing a vertical oxide etch and performing a horizontal oxide etch.

3. The method of claim 1, wherein the undercutting of each fin in the exposed set of fins includes performing a horizontal silicon etch.

4. The method of claim 3, wherein undercutting of each fin in the exposed set of fins results in a portion of each fin having a width of approximately 5 nanometers (nm) to approximately 10 nm.

5. The method of claim 1, wherein the substantially filling of each notch includes conformally depositing the insulator.

6. The method of claim 1, further comprising:
    removing the protective cap layer after the substantially filling of each notch with an insulator and before the forming of the gate dielectric.

7. The method of claim 1, further comprising:
    prior to the removing of the dummy gate, forming a fin-shaped field-effect-transistor (FINFET) on the substrate, the FINFET including the set of fins on the substrate and the dummy gate over the set of fins.

8. The method of claim 1, wherein the forming of the protective cap layer includes epitaxially growing silicon germanium.

9. A method of forming an integrated circuit structure, the method comprising:
    forming a fin-shaped field-effect-transistor (FINFET) on a substrate, the FINFET including a set of fins on the substrate, a dummy gate over the set of fins, and a dielectric substantially separating each fin in the set of fins from an adjacent fin in the set of fins;
    removing the dummy gate stack to expose the set of fins;
    forming a protective cap layer over the exposed set of fins;
    removing a portion of dielectric on each side of each fin in the exposed set of fins;
    undercutting each fin in the exposed set of fins by removing a portion of each fin in the exposed set of fins to create a notch disposed under the protective cap layer;
    substantially filling each notch with an insulator,
        wherein the substantially filling of each notch includes forming the insulator such that a sidewall of the insulator is coplanar with a sidewall of the protective cap layer;
    forming a gate dielectric over each fin in the exposed set of fins; and
    forming a gate conductor over the gate dielectric, thereby forming the integrated circuit structure.

10. The method of claim 9, wherein the removing the portion of the dielectric includes performing a vertical oxide etch and performing a horizontal oxide etch.

11. The method of claim 9, wherein undercutting of each fin in the exposed set of fins includes performing a horizontal silicon etch.

12. The method of claim 11, wherein undercutting of each fin in the exposed set of fins results in a portion of each fin having a width of approximately 5 nanometers (nm) to approximately 10 nm.

13. The method of claim 9, wherein the substantially filling of each notch includes conformally depositing the insulator.

14. The method of claim 9, further comprising:
    removing the protective cap layer after the substantially filling of each notch with the insulator and before the forming of the gate dielectric.

15. A fin-shaped field-effect-transistor (FINFET) comprising:

a set of fins on a substrate, each fin in the set of fins being separated from an adjacent fin in the set of fins by a dielectric;

wherein each fin in the set of fins includes a notched first portion having a width that is smaller than a remaining portion of the fin;

an insulator being disposed over the dielectric and being adjacent to the notched first portion of each fin in the set of fins;

a gate dielectric being disposed over a portion of the insulator and over a second portion of each fin in the set of fins, and wherein the gate dielectric contacts an entire sidewall of the insulator; and a gate conductor over the gate dielectric, wherein the notched first portion of each fin in the set of fins is covered by the gate conductor, and wherein the notched first portion is disposed beneath the gate dielectric and gate conductor and does not extend into source and drain regions of each fin in the set of fins.

16. The FINFET of claim 15, further comprising a protective cap layer disposed between the gate dielectric and the second portion of each fin in the set of fins.

17. The FINFET of claim 15, wherein the notched first portion of each fin in the set of fins includes a width of approximately 5 nanometers (nm) to approximately 10 nm.

18. The FINFET of claim 15, wherein the gate dielectric includes silicon oxide.

19. The FINFET of claim 15, wherein the gate conductor includes at least one of: tungsten, tantalum, and titanium.

20. The FINFET of claim 15, wherein the insulator layer includes at least one of: silicon dioxide, silicon oxynitride, fluorinated silicon dioxide, or oxynitride.

* * * * *